(12) United States Patent
Shen et al.

(10) Patent No.: US 8,862,443 B2
(45) Date of Patent: Oct. 14, 2014

(54) GENERATING DATA FOR GEOMECHANICAL MODELING

(75) Inventors: Xinpu Shen, Stafford, TX (US); Xiaomin Hu, Missouri City, TX (US)

(73) Assignee: Landmark Graphics Corporation, Houston, TX (US)

( * ) Notice: Subject to any disclaimer, the term of this patent is extended or adjusted under 35 U.S.C. 154(b) by 0 days.

(21) Appl. No.: 13/980,868

(22) PCT Filed: Feb. 22, 2011

(86) PCT No.: PCT/US2011/025732
§ 371 (c)(1),
(2), (4) Date: Jul. 19, 2013

(87) PCT Pub. No.: WO2012/115628
PCT Pub. Date: Aug. 30, 2012

(65) Prior Publication Data
US 2013/0346042 A1    Dec. 26, 2013

(51) Int. Cl.
| G06F 7/60 | (2006.01) |
| G06F 17/10 | (2006.01) |
| G01V 3/08 | (2006.01) |
| G06F 17/50 | (2006.01) |

(52) U.S. Cl.
CPC ............ *G06F 17/5018* (2013.01); *G01V 3/083* (2013.01)
USPC ..................................... 703/2; 703/10; 702/6

(58) Field of Classification Search
CPC ..... E21B 43/00; G06F 17/5018; G01V 1/282; G01V 1/302; G01V 3/08; G01V 3/088; G01V 3/087; G01V 3/38; G01V 3/083
USPC .......................................... 703/2, 9–10; 702/6
See application file for complete search history.

(56) References Cited

U.S. PATENT DOCUMENTS

| 5,740,342 | A | * | 4/1998 | Kocberber ................... 345/420 |
| 2010/0204972 | A1 | * | 8/2010 | Hsu et al. ........................ 703/10 |
| 2010/0299111 | A1 | | 11/2010 | Dale et al. |
| 2010/0309749 | A1 | | 12/2010 | Yogeswaren |
| 2011/0011595 | A1 | | 1/2011 | Huang et al. |

OTHER PUBLICATIONS

Authorized Officer Lee W. Young, International Search Report and Written Opinion, PCT/US2011/025732, issued Apr. 19, 2011, 10 pages.

(Continued)

*Primary Examiner* — Eunhee Kim
(74) *Attorney, Agent, or Firm* — Jennifer Trillsch; Fish & Richardson P.C.

(57) ABSTRACT

This specification describes systems, methods, and software relating to geomechanical modeling of a subterranean region (104). In some aspects, finite difference (FD) grid data (200*a*) and finite element (FE) mesh data (202*a*) are received. The FD grid data include FD grid node locations (210) and FD grid values. The FD grid values include values of a subterranean formation property for each FD grid node location. The FE mesh data include FE mesh node locations (212) and spatial domains (214) for each of the FE mesh node locations. Values of the subterranean formation property are generated for each of the FE mesh node locations. The value for a given FE mesh node location is generated based on the FD grid values for FD grid node locations within the spatial domain about the given FE mesh node location. The generated values are assigned to the FE mesh node locations of the FE mesh data (202*b*) for geomechanical modeling of the subterranean region.

20 Claims, 5 Drawing Sheets

(56) References Cited

OTHER PUBLICATIONS

Capasso, et al., "Numerical Simulation of Compaction and Subsidence Using ABAQUS", Eni S.p.A., Exploration and Production Division, Milan, Italy, 2006 ABAQUS User's Conference, 20 pages.

Dean, et al., "A Comparison of Techniques for Coupling Porous Flow and Geomechanics", Mar. 2006 SPE Journal, 9 pages.

Authorized Officer Kamini Shah, PCT International Preliminary Report on Patentability, PCT/US2011/025732, May 17, 2013, 16 pages.

* cited by examiner

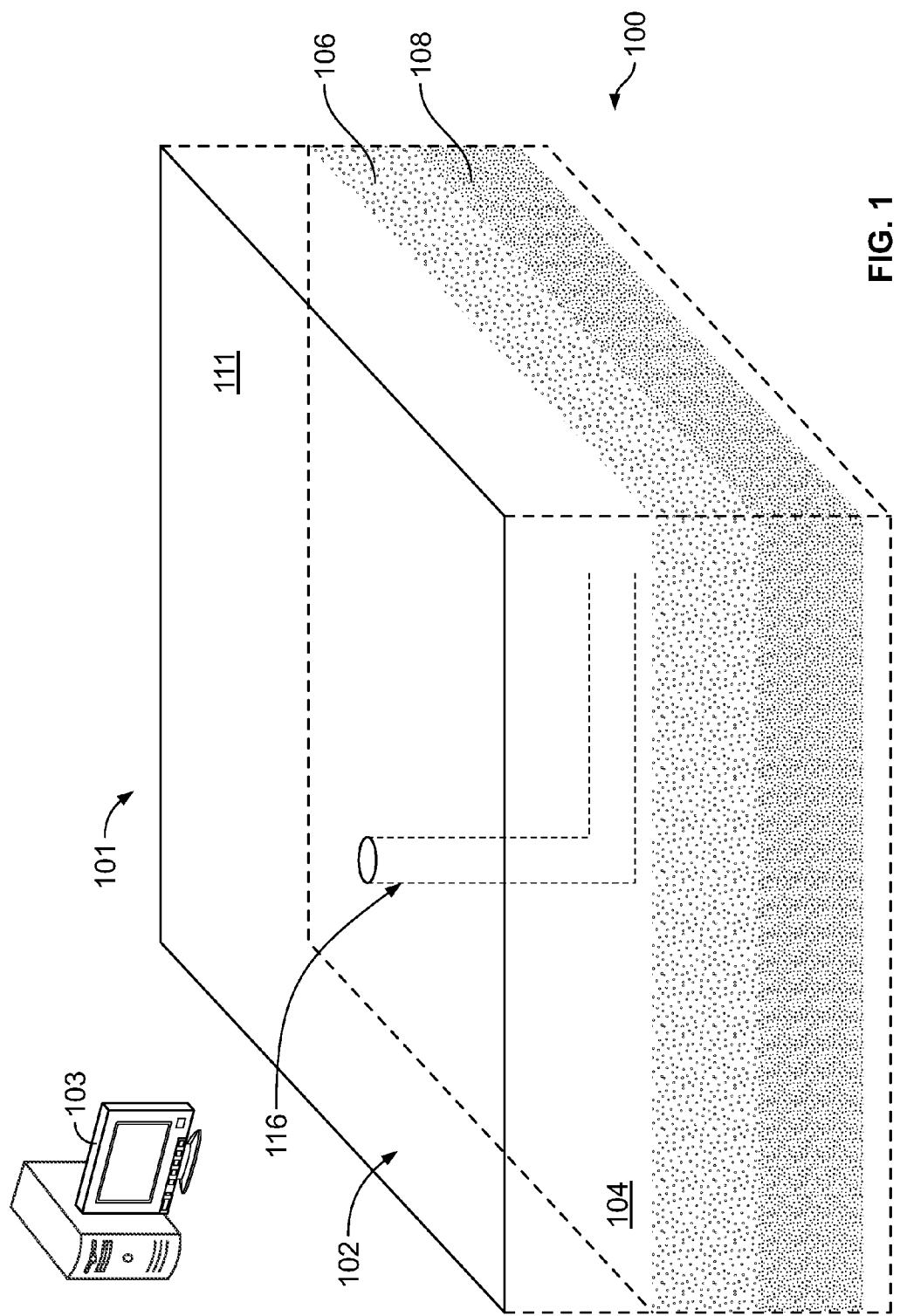

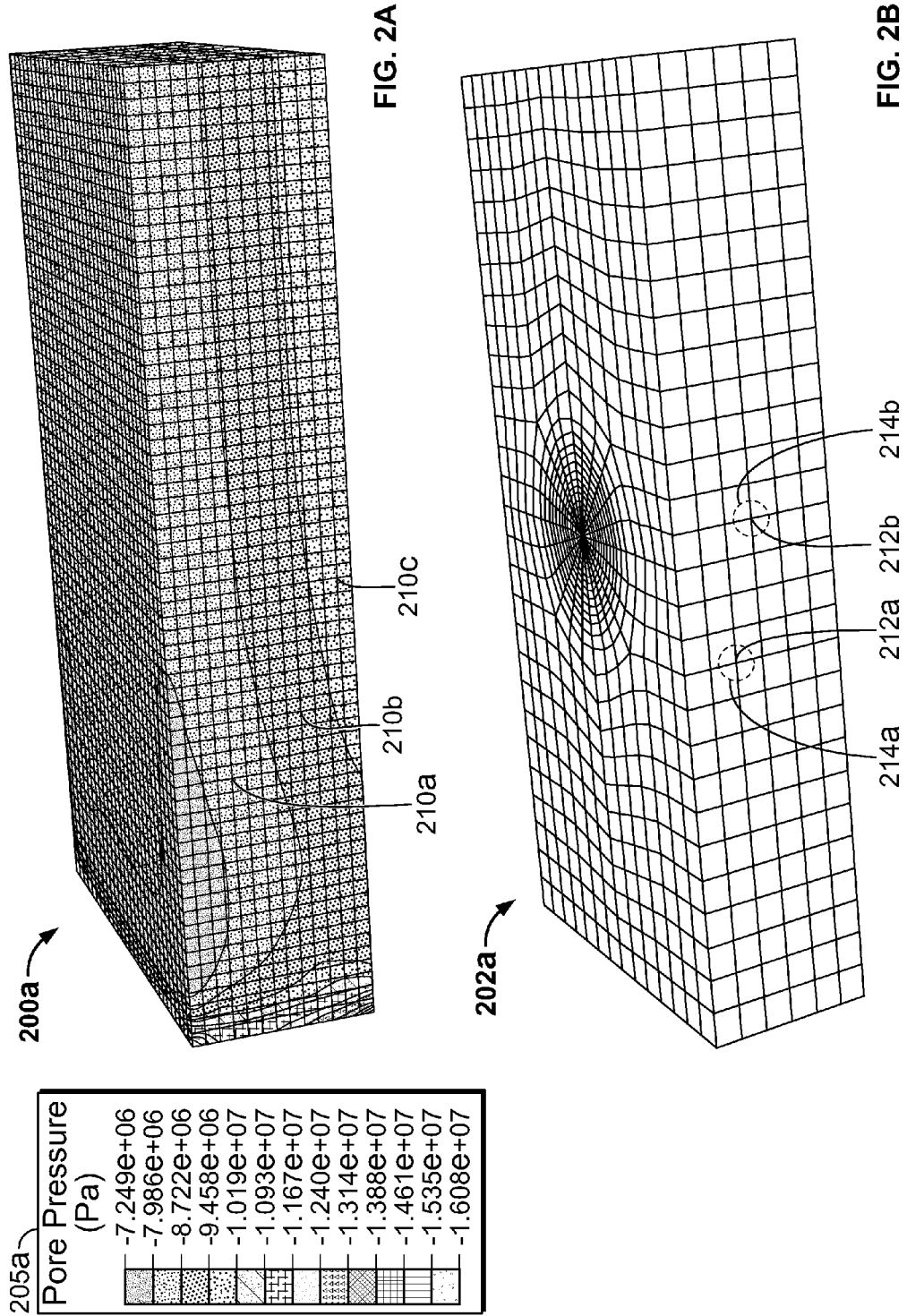

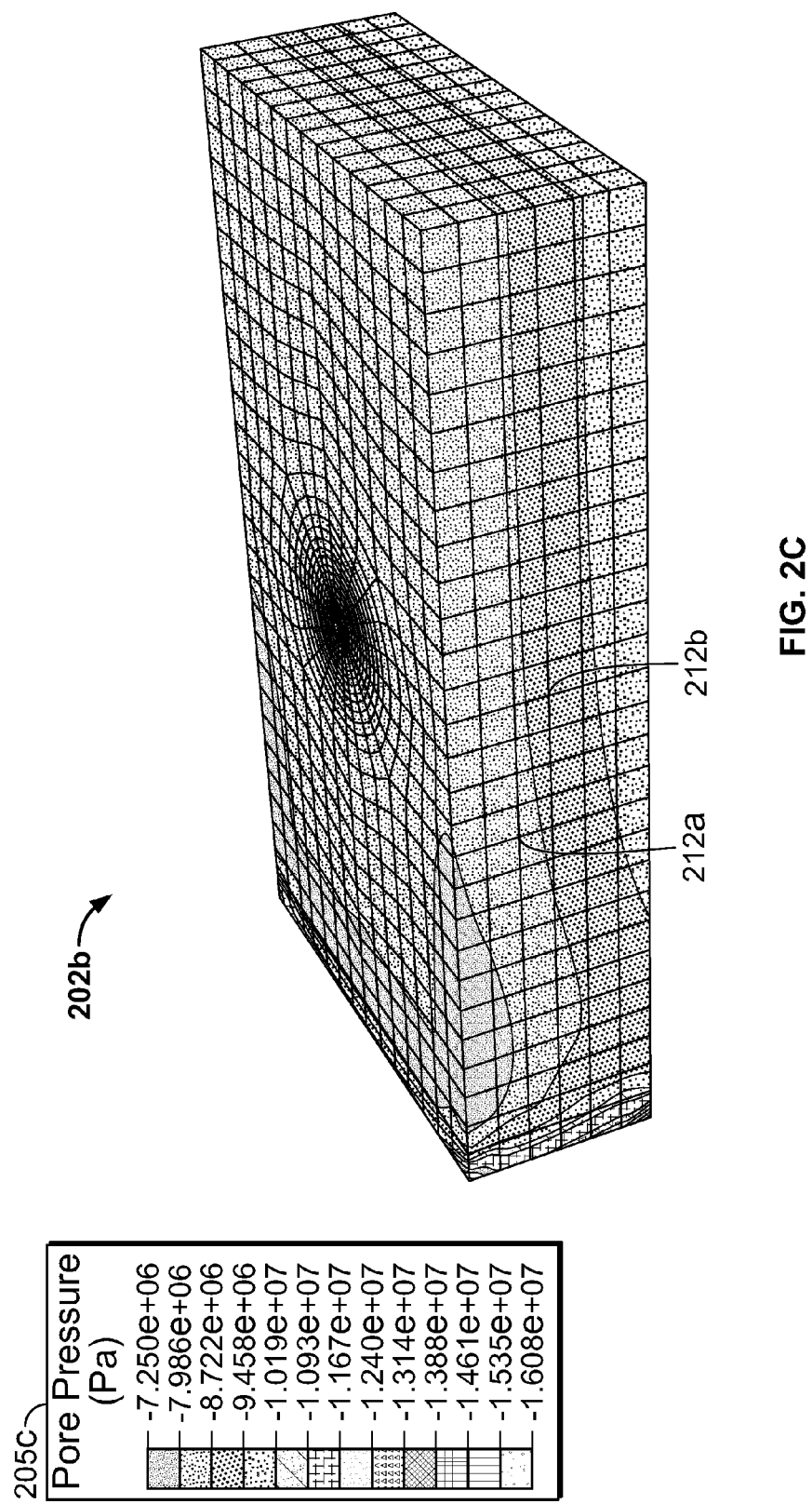

GENERATING DATA FOR GEOMECHANICAL MODELING

BACKGROUND

The present disclosure relates to generating data for geomechanical modeling.

Geomechanical modeling is commonly used to analyze subterranean formations. For example, geomechanical modeling can be used to simulate hydraulic fracturing, production of reservoir fluids, and formation treatment activities. Geomechanical modeling can be implemented using a finite element technique, which models the subterranean formation as a mesh of finite elements. Finite element techniques can model geomechanical properties and dynamics of a subterranean formation, for example, by finding solutions to partial differential equations over complicated domains and domain changes.

SUMMARY

This specification describes systems, methods, and software for modeling a subterranean region. In some implementations, the techniques described herein may be used to generate input data for geomechanical modeling of a subterranean region. For example, input data for a finite element method geomechanical modeling can be generated based on finite difference grid data.

In some aspects, finite difference (FD) grid data and finite element (FE) mesh data are received. The FD grid data include FD grid node locations and grid values for each of the FD grid node locations. The FD grid node locations are locations in a subterranean region, and the FD grid values are values of a subterranean formation property. The FE mesh data include FE mesh node locations and spatial domains for each of the FE mesh node locations. The FE mesh node locations are locations in the subterranean region, and the spatial domains are volumes about each of the FE mesh node locations. FE mesh values of the subterranean formation property are generated for each of the FE mesh node locations. The FE mesh value for each FE mesh node location is generated based on the grid values for the FD grid node locations within the spatial domain about the FE mesh node location. The FE mesh values are assigned to the FE mesh node locations for geomechanical modeling of the subterranean region.

Implementations may include one or more of the following features. Receiving FD grid data and FE mesh data includes receiving reference data. The reference data include a first reference location for the FD grid data and a second reference location for the FE mesh data. The FD grid data and the FE mesh data are aligned by aligning the first reference location and the second reference location.

Additionally or alternatively, implementations may include one or more of the following features. The spatial domain is calculated for each FE mesh node location. Calculating the spatial domain for an FE mesh node location includes calculating a domain radius for the FE mesh node location. Generating the FE mesh values for an FE mesh node location includes identifying the FD grid node locations within the spatial domain about the FE mesh node location. Each FD grid value within the spatial domain of a given FE mesh node location is weighted based on a distance between the FD grid node location and the FE mesh node location. The FE mesh value for the FE mesh node location is calculated by averaging the distance-weighted FD grid values. The resulting FE mesh node values are used for geomechanical modeling to analyze production activities and/or fracturing activities.

The details of one or more embodiments of the subject matter described in this specification are set forth in the accompanying drawings and the description below. Other features, aspects, and advantages of the subject matter will become apparent from the description, the drawings, and the claims.

DESCRIPTION OF DRAWINGS

FIG. 1 is a schematic diagram showing an example system for geomechanical modeling.

FIG. 2A is a schematic diagram showing an example finite difference grid and grid node values.

FIG. 2B is a schematic diagram showing an example finite element mesh.

FIG. 2C is a schematic diagram showing an example finite element mesh and mesh node values for geomechanical modeling.

Like reference symbols in the various drawings indicate like elements.

DETAILED DESCRIPTION

Figure 3:
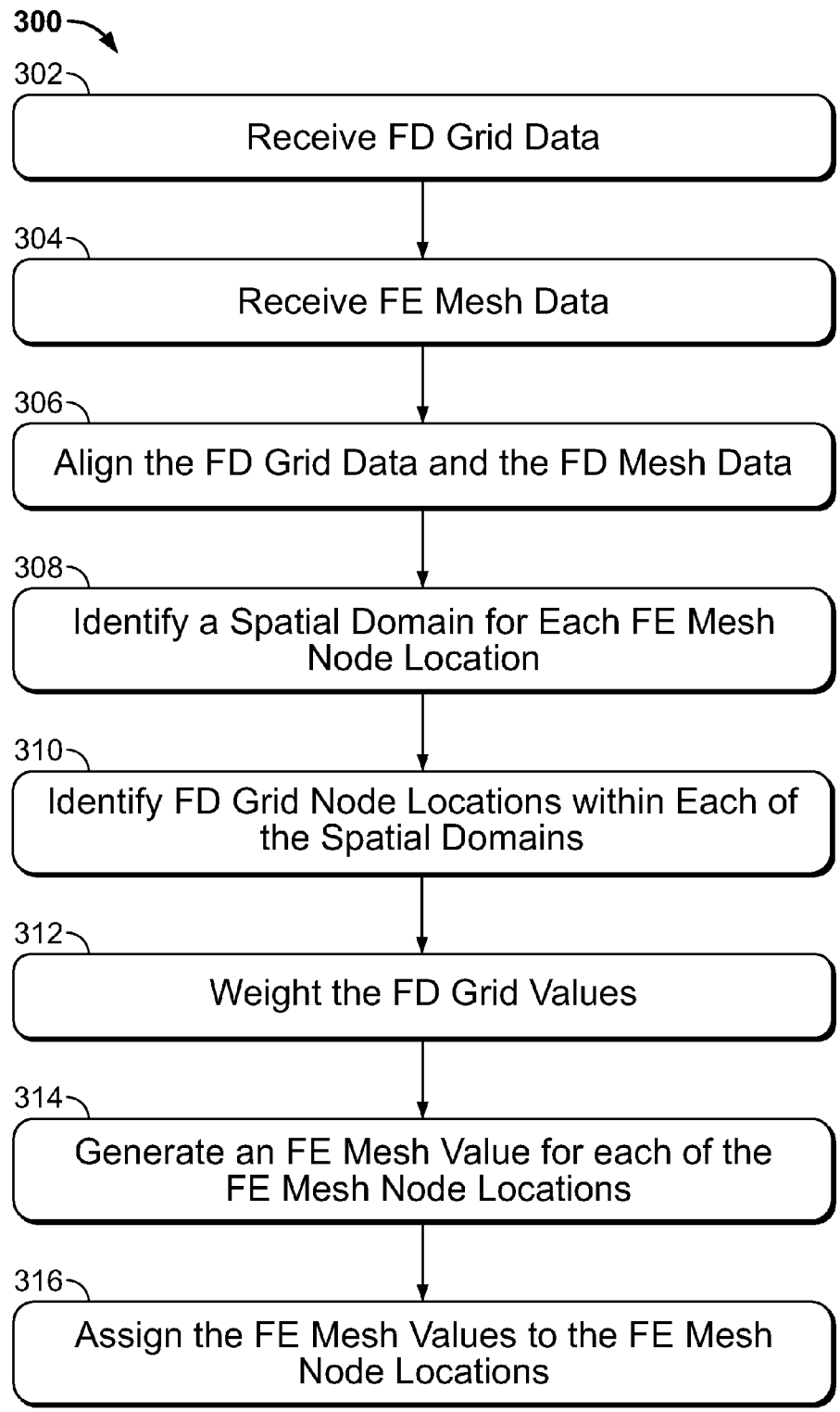
FIG. 3 is a flowchart showing an example technique for generating an FE mesh for geomechanical modeling.

Values of subterranean formation properties can be transferred between different types of representations of the subterranean formation. For example, the values may be adapted from a finite difference (FD) grid to a finite element (FE) mesh. The values of the subterranean formation properties may be adapted to a particular type of data structure, for example, to be used with a particular type of geomechanical modeling technique. For example, FD grid values can be adapted to an FE mesh to generate an input model for FE method-based geomechanical modeling.

FD grids represent physical and mechanical properties (e.g., porosity, density, pore pressure, etc.) of a subterranean region as an array of discrete data points. The FD grid includes FD grid nodes that each represent a location in the subterranean region. The FD grid node locations can be organized in a regular or periodic pattern that spans all or part of the subterranean region. Values of a subterranean formation property can be associated with each FD grid node location. For example, a value for the porosity, density, or pore pressure may be calculated for each FD grid node location and assigned to the corresponding FD grid node. In some cases, FD grid calculations utilize finite difference expressions, for example, of the form $f(x+b)-f(x+a)$ or another form. Such finite difference equations can be used to approximate the solutions of differential equations, and the solutions may provide an estimate of the values of subterranean formation properties at each of the FD grid node locations.

In some instances, it is necessary, useful, or otherwise advantageous to adapt the values in the FD grid to another type of data structure (e.g., an FE mesh) in which the nodes correspond to different or additional locations in the subterranean region. For example, the locations of FE mesh nodes may have a different geometrical arrangement or spacing in the subterranean region than the locations of the FD grid nodes. Consequently, the FE mesh may include FE mesh node locations that are not represented by any particular location in the FD grid. In some cases, the FE mesh node locations have an irregular or non-periodic arrangement in the subterranean region, or FE mesh node locations may be organized in a pattern that is different from the pattern of the FD grid node locations. Also, the FD grid node locations may be more densely spaced in the subterranean region than the FE mesh node locations. The FE method can be used for geomechanical modeling of the subterranean region. For example, the FE method can be used to model mechanical and other aspects of the subterranean region for injection activities, production activities, drilling activities, and/or other types of activities. The FE method calculations can find approximate solutions of partial and ordinary differential equations, systems of differential equations, integral equations, and other types of mathematical models. In some implementations, the FE method can model geomechanical behavior and dynamics of a subterranean formation, for example, by finding solutions to the mathematical models over complicated domains and domain changes.

The FD grid values can be adapted to the FE mesh by identifying a spatial domain for each FE mesh node location and then calculating a value of the subterranean formation property for each FE mesh node location based on the FD grid values within the FE mesh node's spatial domain. For example, the spatial domain of an FE mesh node can be the volume within a specified radius about the corresponding FE mesh node location. Each FE mesh node location can have its own spatial domain radius, for example, based on the characteristic half length of the FE mesh or another property. The FD grid values within the spatial domain of a given FE mesh node location may be averaged or otherwise combined to generate a value of the subterranean formation property for the given FE mesh node location. At a high level, adapting FD grid data to an FE mesh can include aligning the FD grid and the FE mesh based on reference locations for the respective data sets, calculating a spatial domain for each FE mesh node location, and computing a value of the formation property for each FE mesh node location based on the FD grid values in the spatial domain about the FE mesh node location.

FIG. 1 is a schematic diagram showing an example system 100 for geomechanical modeling. The example geomechanical modeling system 100 in FIG. 1 includes a well subsystem 101 and a computing subsystem 103. In some implementations, a geomechanical modeling system may include additional and/or different features, components and/or subsystems. At a high level, the geomechanical modeling system 100 can be used for geomechanical analyses for example, the example system may be used to analyze formation subsidence, hydraulic fracturing operations, well bore stability, production activities, treatment activities and/or others. The well system can include a measurement subsystem that performs measurements of a geographic region 102 to acquire geological data. The measurement subsystem can acquire information about properties of a subterranean formation in the geographic region 102. The subterranean formation properties may include pore pressure, density, porosity and/or other properties of a subterranean material. The information acquired by the measurement subsystem can be processed by the computing subsystem 103 to evaluate, analyze, and/or model aspects of the geographic region 102. In some instances, the components and subsystems of the geomechanical modeling system 100 may perform additional and/or different types of functions.

The geographic region 102 includes a geographic surface 111 and a subterranean region 104 beneath the surface 111. The subterranean region 104 may include various types of structures, which may include geological layers, reservoirs, or other structures. Two example layers 106, 108 are shown in FIG. 1 for illustration purposes. The subterranean region 104 may include any number of layers and/or other types of geological features, which may have any topographical shape, thickness, and/or geometry. For example, the subterranean region 104 may include one or more rock layer having various degrees of porosity, permeability, and/or conductivity, and the subterranean structures may include faults, fractures, fissures, and/or other types of natural or induced discontinuities. In some implementations, the subterranean region 104 may contain hydrocarbon resources (e.g., natural gas, oil, coal, etc.), brine water, and/or other types of resources in a reservoir. For example, a subterranean reservoir may include conventional and/or non-conventional reservoirs.

The example well system 101 shown in FIG. 1 includes a wellbore 116. The wellbore 116 can be part of one or more discovery wells, monitoring wells, injection wells, production wells, and/or other types of wells. A single well bore 116 is shown in FIG 1. In some implementations, the geographic region 102 does not include a wellbore. A well system may include a single well bore or multiple well bores, which may include well bores having vertical, horizontal, slant, curved, and/or other types of geometries. The subterranean region 104 may include fluids injected through one or more injection wells and/or induced fractures generated by the fluid injection. In some instances, one or more sensors or other measurement devices may be installed in a wellbore 116. As such, a measurement subsystem may include components at the surface 111, components in a well bore beneath the surface 111 and/or components at additional or different local or remote locations.

In some implementations, the computing subsystem 103 can calculate values of geomechanical variables for the subterranean region 104. The values may be based on information from a measurement subsystem that acquires data from the geographical region 102. The values may be based on well logs, outcroppings, historical data, analog fields, and/or other sources. The computing subsystem 103 can include data processing systems, devices, and/or components that can store and process information acquired by a measurement subsystem and/or information from other sources. For example, the computing subsystem 103 may include the example computing system 400 shown in FIG. 4 and/or additional or different types of systems and devices. The structure and operation of the example computing system 400 is discussed in more detail with respect to FIG. 4 below. The computing subsystem 103 may include multiple components in a single location and/or in multiple different locations. Some or all components of the computing subsystem 103 may be located remotely from the geographic region 102 and/or the computing subsystem 103 may include components located at or near the geographic region 102.

The computing subsystem 103 may include and/or interact with communication systems and infrastructure. For example, the computing subsystem 103 may interact with one or more data networks (e.g., the Internet, a private data network, etc.), telecommunication networks, wired or wireless communication links, and/or other types of interfaces to receive information relating to the geographic region 102 and/or other types of information. In some implementations, information is delivered to the computing subsystem 103 on a computer-readable medium, such as, for example, a disk, a disk drive, a portable memory device, and/or another type of device.

The computing subsystem 103 may include computer software, applications, modules, codes, functions and/or other types of computer programs that perform operations relating to geomechanical modeling. For example, the computing subsystem 103 may analyze geomechanical data by performing one or more of the operations in the process 300 shown in FIG. 3. In some instances, the computing subsystem 103 can generate and/or receive FD grid data and adapt the FD grid data to an FE mesh.

FIGS. 2A-2C show an example of adapting FD grid data to an FE mesh for geomechanical modeling. FIG. 2A is a schematic diagram showing an example FD grid 200a. FIG. 2B is a schematic diagram showing example FE mesh 202a. FIG. 2C is a schematic diagram showing example FE mesh 202b. The techniques described with respect to FIGS. 2A-2C may be used in connection with other types geomechanical modeling techniques and/or other types of data structures. In FIGS. 2A-2C, the example FD grid 200a, the example FE meshes 202a, 202b all represent the same subterranean region. For example, the example FD grid 200a and the example FE meshes 202a, 202b may all represent part of the subterranean region 104 shown in FIG. 1. The schematic diagrams shown in FIGS. 2A-2C are graphical representations of data structures that are used for geomechanical modeling. As such, the FD grid 200a, and the FE meshes 202a, 202b shown in the figures represent data structures that are defined in memory. The corresponding data structures may be generated, modified, stored, or transformed by data processing apparatus.

The FD grid 200a is shown in FIG. 2A as a three-dimensional Cartesian grid, with the FD grid nodes spaced evenly throughout the FD grid 200a. The FD grid nodes represent individual locations within the subterranean region. Three example FD grid nodes 210a, 210b, 210c are shown in FIG. 2A. The FD grid 200a can include distinct values of subterranean formation properties for each of the FD grid nodes. FIG. 2A shows a range of pore pressure values for each of the FD grid nodes for clarity of illustration. As indicated by the legend 205a, each type of shading in FIG. 2A represents a different range of pore pressure values in units of Pascal (Pa). The negative values of pore pressure indicate a compressive pressure. According to the legend 205a, the shading around the FD grid node 210a indicates that the pore pressure at the FD grid node 210a is between $-7.986\ (10)^6$ Pa and $-8.722\ (10)^6$ Pa, the shading around the FD grid node 210b indicates that the pore pressure at the FD grid node 210b is between $-8.772\ (10)^6$ Pa and $-9.458\ (10)^6$ Pa, the shading around the FD grid node 210a indicates that the pore pressure at the FD grid node 210a is between $-9.458\ (10)^6$ Pa and $-1.019\ (10)^7$ Pa. While the examples in FIGS. 2A and 2C show only pore pressure values, additional and/or different types of subterranean formation properties may be included in an FD grid or an FE mesh.

The FE mesh 202a is shown in FIG. 2B as a three-dimensional mesh, with the FE mesh nodes at various locations throughout the FE mesh 202a. The FE mesh nodes represent individual locations within the subterranean region. Two example FE mesh nodes 212a, 212b are shown in FIG. 2B. Each FE mesh node has an associated spatial domain. The spatial domains may have any geometry. Two example spatial domains 214a, 214b are shown in the example FE mesh 202a in FIG. 2B. The spatial domain 214a represents a spheroidal volume in the subterranean region about the location of the FE mesh node 212a, and the spatial domain 214b represents a spheroidal volume in the subterranean region about the location of the FE mesh node 212b. Each FE mesh node may have a distinct spatial domain. For example, the spatial domain of each FE mesh node may depend on the distances to neighboring FE mesh nodes. The spatial domain for each FE mesh node may be represented as a domain radius or one or more other characteristic values. In some instances, the spatial domain for each FE mesh node is a sphere having a radius equal to the characteristic half length for the FE mesh node. The characteristic half length of an FE mesh node can be half the average distance to the FE mesh node's nearest neighbor nodes. In some cases, the spatial domain can have a non-spherical or irregular geometry. The spatial domains of the FE mesh nodes may overlap. For example, two or more neighboring FE mesh nodes may have overlapping spatial domains.

In the examples shown in FIGS. 2A and 2B, the locations of the FE mesh nodes and the locations of FD grid nodes are independent of each other. The FD grid 200a is used for FD modeling techniques, and therefore the FD grid node locations may be based on constraints, features, or requirements of a particular FD modeling technique. For example, the FD grid node locations shown in FIG. 2A are arranged in a cubic pattern. The FE mesh 202a is used for FE modeling techniques, and therefore the FE mesh node locations may be based on constraints, features, or requirements of a particular FE modeling technique. For example, the FE mesh 202a includes a region of substantially cylindrical geometry (which may correspond, for example, to a region near a wellbore) and a region of substantially rectangular geometry (which may correspond to a bulk region far from a wellbore). As such, there is not necessarily a direct correspondence between any of the FE mesh node locations and any of the FD grid node locations. In some implementations, the FD grid node locations are more densely located in the subterranean region than the FE mesh node locations.

The FE mesh 202b shown in FIG. 2C includes pore pressure values for each of the mesh node locations, so that the pore pressure information can be incorporated into FE method geomechanical modeling of the subterranean region. The FE mesh 202b shown in FIG. 2C is the FE mesh 202a of FIG. 2B with pore pressure values adapted from the FD grid 200a of FIG. 2A. For example, the process 300 shown in FIG. 3 may be used to calculate pore pressure values for each of the FE mesh node locations based on the FD grid 200a and the FE mesh 202a. According to the legend 205c in FIG. 2C, the shading around the FE mesh node 212a indicates that the pore pressure at the FE mesh node 212a is between $-7.986\ (10)^6$ Pa and $-8.722\ (10)^6$ Pa, and the shading around the FE mesh node 210b indicates that the pore pressure at the FE mesh node 212b is between $-8.772\ (10)^6$ Pa and $-9.458\ (10)^6$ Pa. The FE mesh 202b can include distinct values of subterranean formation properties for each of the FE mesh nodes. FIG. 2C shows a range of pore pressure values for each of the FE mesh nodes for clarity of illustration.

The pore pressure values are adapted from the FD grid 200a by averaging the pore pressure values from multiple FD grid node locations for each of the FE mesh node locations. In particular, the FD grid 200a and the FE mesh 202a are aligned, the pore pressure values for the FD grid node locations within the spatial domain of each FE mesh node location are averaged, and the resulting average value is assigned to the FE mesh node location. The average may be a distance-weighted average, for example, weighting each of the pore pressure values by the distance between the FD grid node location and the FE mesh node location. Where the density of the FD grid node locations is higher or comparable to the density of the FE mesh node locations, the pore pressure values for multiple FD grid node locations can be used to calculate the pore pressure at each HD mesh node location. Where the spatial domains of the FE mesh nodes overlap, a given FD grid node location may be used to calculate a pore pressure value for multiple different FE mesh nodes.

FIG. 3 is a flowchart showing an example process 300 for generating an FE mesh for geomechanical modeling. The process 300 may be used to assign values to the nodes of the FE mesh. For example, the process 300 may be used to generate the FE mesh 202b of FIG. 2C based on the FD grid 200a of FIG. 2A and the FE mesh 202a of FIG. 2B. The process 300 may be used to generate additional and/or different types of data structures for geomechanical modeling. In some implementations, the process 300 may include additional, fewer, and/or different operations performed in the order shown or in a different order. Moreover, one or more of the individual operations and/or subsets of the operations in the process 300 can be performed in isolation and/or in different contexts to achieve a similar or different result. In some implementations, one or more of the operations in the process 300 may be iterated, repeated, omitted, modified, and/or performed by multiple sub-operations. Some or all aspects of the process 300 may be implemented by data processing apparatus executing computer-readable instructions, which may be included in one or more software programs, modules, or applications configured to provide the functionality described.

At 302, FD grid data are received. The FD grid data includes FD grid node locations and FD grid values. The FD grid locations are geological locations for the nodes of an FD grid. One or more FD grid values may be associated with each of the FD node locations. The one or more FD grid values can include values of geomechanical variables associated with subterranean formation properties. The subterranean formation properties may include, for example, pore pressure, density, porosity, and/or others.

At 304, FE mesh data are received. The FE mesh data include FE mesh node locations and spatial domains associated with each of the FE mesh node locations. At 306, the FD data and FE data are aligned. The data may be aligned based on reference data. For example, although the individual FE mesh node locations generally do not align with individual FD grid node locations, the FD grid and the FE mesh may be aligned to identify the locations of the FD grid nodes relative to the locations of the FE mesh nodes. The FE mesh data and the FD grid data may each include one or more reference points or axes that can be used to align the data sets.

At 308, a spatial domain is identified fix each FE mesh node location. In some implementations, the spatial domain for each FE mesh node location is associated with a domain radius. The domain radius for each FE mesh node location can be determined based on the FE mesh data. For example, the domain radius for each FE mesh node can be calculated based on the characteristic half-length associated with the FE mesh node. In some implementations the radius can be determined based on input from a user and/or based on other types of information. The spatial domains are used to correlate multiple FD grid node locations to each FE mesh node location. At 310, the FD grid node locations within the spatial domain of each FE mesh node is identified.

At 312, the FD grid values within each spatial domain can be weighted. The weighting coefficient for an FD grid value can be based on the distance between the FD grid node location and the FE mesh node location. In some implementations, a weighting coefficient can be determined by a power law, exponential, or other type of weighting function. Additional or different types of weighting algorithms can be used, and in some cases the FD grid values are not weighted. A single FD grid value that resides in multiple different spatial domains may be weighted differently for each of the different spatial domains.

At 314, FE mesh values are generated for the FE mesh node locations. The FE mesh values can be calculated by averaging the FD grid values within each spatial domain. In cases, a distance-weighted average of the FD grid values is used. The distance-weighted average can be calculated based on distance-weighted FD grid values calculated at 312. At 316, the FE mesh values are assigned to FE mesh node locations. For example, the FE mesh value generated from the FD grid values within a given spatial domain can be assigned to the FE mesh node location associated with the given spatial domain.

Figure 4:
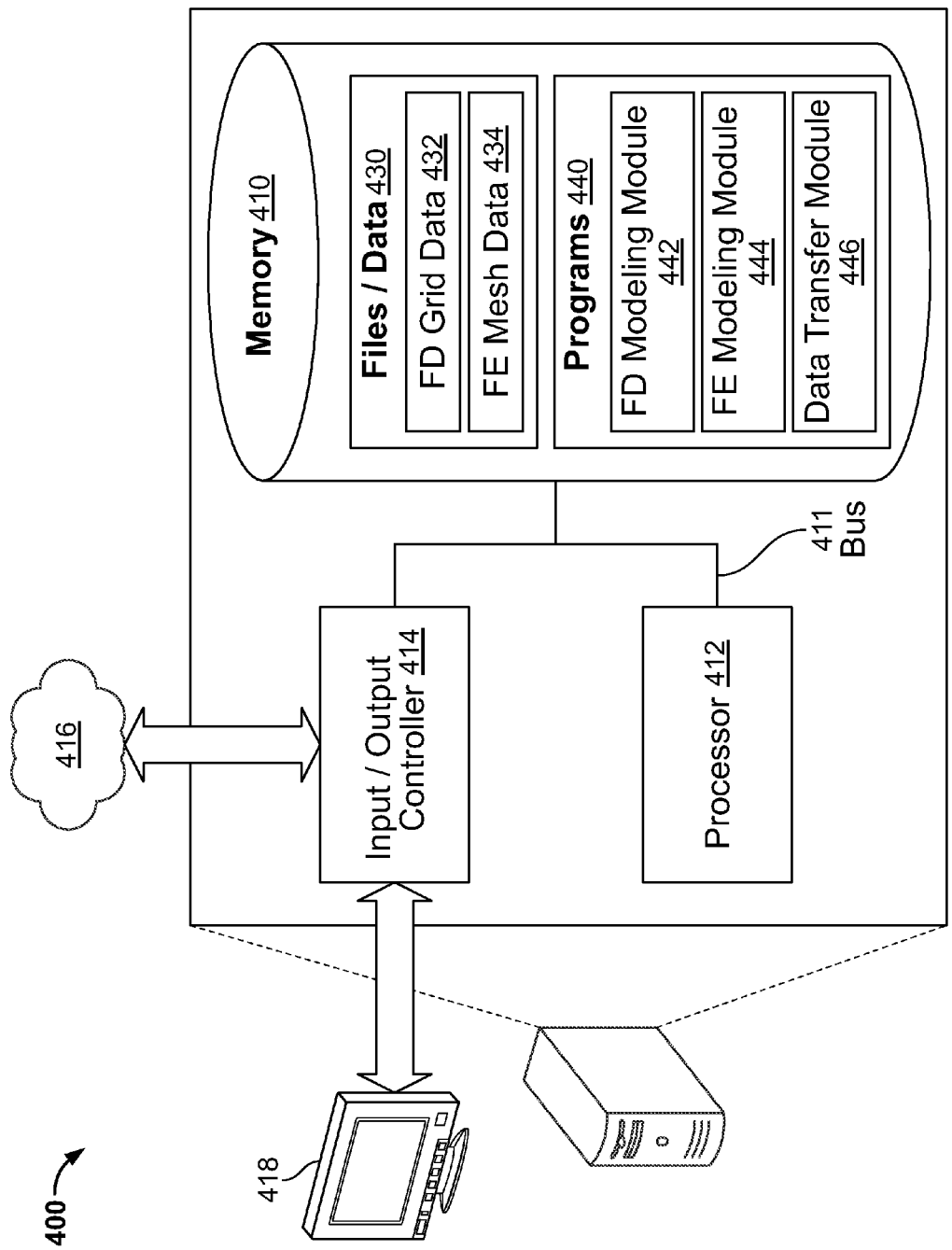
FIG. 4 is a schematic representation of an example computing subsystem.

FIG. 4 is a schematic representation of example computing system 400. One or more aspects of the computing subsystem 103 in FIG. 1 may he implemented by the example computing system 400, which may operate in coordination with one or more other computing systems in additional and/or different locations. In some instances, the example computing system 400 may perform one or more operations of the example process 300 shown in FIG. 3. In some instances, the computing system 400 may generate, process, transform and/or manipulate the data represented in FIGS. 2A-2C. The computing subsystem 400 may include additional and/or different components and may be configured to operate in a different manner.

The example computing system 400 includes a processor 412, a memory 410, and input/output controllers 414 communicably coupled by a bus 411. The memory 410 can include, for example, a random access memory (RAM), a storage device (e.g., a writable read-only memory (ROM) and/or others), a hard disk, and/or another type of storage medium. The computing system 400 can be preprogrammed and/or it can be programmed (and reprogrammed) by loading a program from another source (e.g., from a CD-ROM, from another computer device through a data network, and/or in another manner). The input/output controller 414 is coupled to input/output devices (e.g., a monitor 418, a mouse, a keyboard, and/or other input/output devices) and to a network 416. The input/output devices receive and transmit data in analog or digital form over communication links such as a serial link, wireless link (e.g., infrared, radio frequency, and/or others), parallel and/or another type of link. The network 416 can include any type of data communication network. For example, the network 416 can include a wireless and/or a wired network, a Local Area Network (LAN), a Wide Area Network (WAN), a private network, a public network (such as the Internet), a WiFi network, a network that includes a satellite link, and/or another type of data communication network.

The memory 410 can store instructions (e.g., computer code) associated with an operating system, computer applications and programs, and/or other resources. The memory 410 can also store application data and data objects that can be interpreted by one or more applications and/or virtual machines running on the computing system 400. As shown in FIG. 4, the example memory 410 includes data 430 and programs 440. In some implementations, a memory of a computing device may include some or all of the information shown in the example memory 410. The memory 410 may store additional information, for example, files and instruction associated with an operating system, device drivers, archival data, and/or other types of information.

The files and data stored in the memory 410 include information relating to geomechanical modeling. In the example shown, the memory 410 stores FD grid data 432 and FE mesh data 434. The memory 410 may store additional and/or different types of information relating to geomechanical modeling. The FD grid data 432 and FE mesh data 434 may include geological data and/or mechanical relating to the geographical region. 102 in FIG. 1. For example, the FD grid data 432 may include geological location information for FD grid nodes and/or values of subterranean formation properties; the FE mesh data 434 may include geological location information for the FE mesh nodes and/or values of subterranean formation properties.

The programs 440 can include software applications, scripts, programs, functions, executables, and/or other modules that are interpreted and/or executed by the processor 412. In the example shown, the programs 440 include an FD modeling module 442, an FE modeling module 444 and a data transfer module 446. The programs 440 may include machine-readable instructions for performing one or more of the operations shown in FIG. 3. Generally, the geomechanical analysis programs 440 can include high-level code, tow-level code, source code, object code, machine code, or a combination of these and/or other types of code. The programs 440 may be written in C, C++, Perl, MATLAB and/or other types of compiled, interpreted, or executable programming languages. The FD modeling module 442 can perform geomechanical modeling based on a finite difference technique. The FD modeling module 442 may generate and process FD grid data, such as the example PD grid 200a shown in FIG. 2A. The FE modeling module 444 can perform geomechanical modeling based on a finite element technique. The FE modeling module 444 may generate and process FE mesh data, such as the example FE mesh data 202a, 202b shown in FIGS. 2B and 2C. The data transfer module 446 can generate values of subterranean formation properties for a FE mesh based on an FD grid. For example, the data transfer module 446 may perform one or more of the operations shown in FIG. 3 to generate the FE mesh 202b shown in FIG. 2C.

The processor 412 can execute instructions, for example, to generate output data based on data inputs. For example, the processor 412 can run the programs 440 by executing and/or interpreting the software, scripts, functions, executables, and/or other modules contained in the programs 440. For example, the processor 412 may perform one or more of the operations shown in FIG. 3. The input data received by the processor 412 and/or the output data generated by the processor 412 may include any of the FD grid data, FE mesh data and/or other types of data, which can be stored in a computer-readable medium.

Some aspects of the subject matter and the operations described in this specification can be implemented in digital electronic circuitry, or in computer software, firmware, or hardware, including the structures disclosed in this specification and their structural equivalents, or in combinations of one or more of them. Some aspects of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

Operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand atone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Aspects of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a Global Positioning System (GPS) receiver, or a portable storage device universal serial bus (USB) flash drive), and other types of devices. Devices suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, aspects of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Some aspects of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In sonic embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any what may be claimed, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described components and systems can generally be integrated together in a single product or packaged into multiple products.

In the present disclosure, "each" refers to each of multiple items or operations in a group, and may include a subset of the items or operations in the group and/or all of the items or operations in the group. In the present disclosure, the term "based on" indicates that an item or operation is based at least in part on one or more other items or operations and may be based exclusively, partially, primarily, secondarily, directly, or indirectly on the one or more other items or operations.

A number of embodiments of the invention have been described. Nevertheless, it will be understood that various modifications may be made without departing from the spirit and scope of the invention. Accordingly, other embodiments are within the scope of the following claims.

What is claimed is:

1. A method of generating geomechanical modeling input data, the method comprising:
    receiving finite difference (FD) grid data identifying:
        FD grid node locations in a subterranean region; and
        FD grid values of a subterranean formation property for each of the FD grid node locations;
    receiving finite element (FE) mesh data identifying FE mesh node locations in the subterranean region;
    calculating spatial domains about the FE mesh node locations, each of the spatial domains associated with one of the FE mesh node locations and calculated based on one or more other FE mesh node locations;
    generating FE mesh values of the subterranean formation property for the FE mesh node locations, the FE mesh value for each FE mesh node location generated based on the FD grid values for multiple FD grid node locations within the spatial domain about the FE mesh node location; and
    assigning the FE mesh values of the subterranean formation property to the FE mesh node locations for geomechanical modeling of the subterranean region.

2. The method of claim 1, further comprising:
    receiving reference data identifying a first reference location for the FD grid data and a second reference location for the FE mesh data; and
    aligning the FD grid data and the FE mesh data based on aligning the first reference location and the second reference location.

3. The method of claim 1, wherein calculating the spatial domain about the FE mesh node locations includes calculating a domain radius for each of the FE mesh node locations.

4. The method of claim 1, wherein generating the FE mesh values comprises, for each FE mesh node location:
    identifying each of the multiple FD grid node locations within the spatial domain about the FE mesh node location;
    weighting the FD grid values for each of the multiple FD grid node locations within the spatial domain based on distances between the FD grid node locations and the FE mesh node location; and
    generating the FE mesh value for the FE mesh node location based on averaging the distance-weighted FD grid values.

5. The method of claim 1, wherein the subterranean formation property comprises at least one of pore pressure, porosity, or density.

6. The method of claim 1, further comprising performing the geomechanical modeling to analyze at least one of production activities or fracturing activities.

7. A geomechanical modeling system comprising:
a memory that stores finite difference (FD) grid values of a subterranean formation property for each of a plurality of the FD grid node locations; and
a data processing apparatus configured to:
calculate spatial domains for a plurality of FE mesh node locations, each of the spatial domains associated with one of the FE mesh node locations and calculated based on one or more of the other FE mesh node locations; and
generate finite element (FE) mesh values of the subterranean formation property for each of the plurality of FE mesh node locations based on the FD grid values, the FE mesh value for each FE mesh node location generated based on the FD grid values for multiple FD grid node locations within the calculated spatial domain about the FE mesh node location.

8. The system of claim 7, the data processing apparatus further configured to align a reference location of an FD grid with a reference location of an FE mesh.

9. The system of claim 7, wherein calculating the spatial domains for the plurality of FE mesh node locations includes calculating a domain radius for each of the FE mesh node locations.

10. The system of claim 7, wherein generating the FE mesh values comprises, for each FE mesh node location:
identifying each of the multiple FD grid node locations within the spatial domain about the FE mesh node location;
weighting the FD grid value for each of the multiple FD grid node locations within the spatial domain based on a distance between the FD grid node location and the FE mesh node location; and
generating the FE mesh value for the FE mesh node location based on averaging the distance-weighted FD grid values.

11. The system of claim 7, wherein the subterranean formation property comprises at least one of pore pressure, porosity, or density.

12. The system of claim 7, the data processing apparatus further configured to assign the FE mesh values to the FE mesh node locations.

13. The system of claim 7, the data processing apparatus further configured to model geomechanical aspects of production activities in the subterranean formation based on the FE mesh values.

14. The system of claim 7, the data processing apparatus further configured to model geomechanical aspects of injection activities in the subterranean formation based on the FE mesh values.

15. A non-transitory computer-readable medium encoded with instructions for generating geomechanical modeling input data, the instructions when executed perform operations comprising:
receiving FD grid values of a subterranean formation property for each of a plurality of the FD grid node locations in a subterranean formation;
determining spatial domains about a plurality of FE mesh node locations in the subterranean formation, each of the spatial domains associated with one of the plurality of FE mesh node locations and determined based on one or more other FE mesh node locations;
generating FE mesh values of the subterranean formation property for the FE mesh node locations, the FE mesh value for each FE mesh node location generated based on the FD grid values for multiple FD grid node locations within the spatial domain about the FE mesh node location.

16. The non-transitory computer-readable medium of claim 15, the operations further comprising aligning an FD grid with an FE mesh.

17. The non-transitory computer-readable medium of claim 15, wherein generating the FE mesh values comprises, for each FE mesh node location:
identifying each of the multiple FD grid node locations within the spatial domain about the FE mesh node location;
weighting the FD grid value for each of the multiple FD grid node locations within the spatial domain based on a distance between the FD grid node location and the FE mesh node location; and
generating the FE mesh value for the FE mesh node location based on averaging the distance-weighted FD grid values.

18. The non-transitory computer-readable medium of claim 15, wherein the subterranean formation property comprises at least one of pore pressure, porosity, or density.

19. The non-transitory computer-readable medium of claim 15, further comprising:
assigning the FE mesh values to the FE mesh node locations; and
using the FE mesh values assigned to the FE mesh node locations for geomechanical modeling of the subterranean formation.

20. The method of claim 3, wherein the domain radius for each FE mesh node location is calculated based on a characteristic half length associated with the FE mesh node location.

* * * * *